(12) United States Patent
Mueller et al.

(10) Patent No.: US 6,272,062 B1
(45) Date of Patent: Aug. 7, 2001

(54) SEMICONDUCTOR MEMORY WITH PROGRAMMABLE BITLINE MULTIPLEXERS

(75) Inventors: Gerhard Mueller, Wappingers Falls; Toshiaki Kirihata, Poughkeepsie; Dmitry Netis, Brooklyn, all of NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/583,596

(22) Filed: May 31, 2000

(51) Int. Cl.[7] .................................................. G11C 8/00
(52) U.S. Cl. ............................ 365/230.02; 365/230.03; 365/189.02
(58) Field of Search ...................... 365/230.02, 230.03, 365/189.02

(56) References Cited

U.S. PATENT DOCUMENTS

| | | | |
|---|---|---|---|
| 6,052,303 | * 4/2000 | Chevallier et al. | 365/185.03 |
| 6,061,290 | * 5/2000 | Shirley | 365/230.02 |
| 6,084,819 | * 7/2000 | Kablanian | 365/230.03 |
| 6,091,620 | * 7/2000 | Kablanian | 365/63 |
| 6,091,667 | * 7/2000 | Tanaka et al. | 365/235.5 |

* cited by examiner

Primary Examiner—David Nelms
Assistant Examiner—Connie C. Yoha
(74) Attorney, Agent, or Firm—Stanton C. Braden

(57) ABSTRACT

There is provided a semiconductor memory device that includes: a plurality of memory cells arranged in at least two groups; at least one sense amplifier; a first and a second multiplexer; and at least one programmable control device. Each multiplexer is adapted to couple at least one of the groups to the amplifier. The programmable control device is adapted to control the first and said second multiplexers. In one embodiment, the programmable control device is adapted to control the multiplexers independently.

31 Claims, 17 Drawing Sheets

SEMICONDUCTOR MEMORY WITH PROGRAMMABLE BITLINE MULTIPLEXERS

TECHNICAL FIELD

The present invention relates generally to semiconductor memories and, in particular, to a semiconductor memory with programmable bitline multiplexers.

BACKGROUND DESCRIPTION

CMOS technology has evolved such that the computer market has rapidly opened to a wide range of consumers. Today, multi-media applications generally require at least 64 MB memory of memory and, preferably, 128 MB of memory. Such memory requirements increase the relative cost of the memory system within a computer. In the near future, it is likely that 256 MB and 512 MB computers will become commonplace, which suggests a potentially strong demand for 256 Mb Dynamic Random Access Memories (DRAMs) and those of a larger capacity. The creation of DRAMs in the gigabit range is already under way; however, such high-density DRAMs are still in the development stage. As DRAM density and lithographic difficulties increase, the testing of memory cells in a semiconductor memory becomes a more critical element in the development and production of DRAMs.

FIG. 1 is a dynamic random access memory (DRAM) 100 having a typical structure according to the prior art. The DRAM 100 includes a first array 102n+1, a second array 102n, and a third array 102n−1. Each array contains a plurality of memory cells arranged in a matrix. Each memory cell consists of an NMOS transistor 110 and a capacitor $C_S$. A memory cell holds a data bit as a capacitive charge voltage in capacitor $C_S$. The read or write operation of the data bit is controlled by a wordline WL. The horizontally running WL is coupled to the gates of a plurality of the NMOS transistors 110. When the WL rises, the corresponding NMOS transistor 110 couples the corresponding capacitor $C_S$ to a bitline BL, allowing the data bit in the capacitor $C_S$ to be accessed through the bitline BL. Each vertically running bitline BL is coupled to the drains of a plurality of the NMOS transistors 110, thereby supporting a plurality of the memory cells (i.e. 256 for 256 Mb DRAM).

For the sake of simplicity, the capacitance of a bitline is modeled as a capacitor $C_{BL}$. When the wordline WL rises, the charge of the capacitor $C_S$ is shared with the charge of the capacitor $C_{BL}$, changing a bitline voltage (sensing voltage). The following discussion presumes that the capacitor $C_S$ stores a supply voltage (Vdd) or 0V, and that the bitline BL is originally precharged to 2Vdd. The sensing signal is thus determined by $\pm 2\text{Vdd}(C_S/(C_S+C_{BL}))$. Typically, capacitor $C_S$ and capacitor $C_{BL}$ are about 30 fF and 120 fF, respectively. For Vdd=2V, the sensing signal= 200 mV. Each bitline pair (BL and $\overline{\text{BL}}$) is supported by a corresponding sense amplifier SA. When sense amplifier SA is turned ON, the sensing signal of 200 mV is amplified, making the bitline BL and the bitline $\overline{\text{BL}}$ go HIGH and LOW, respectively (or vice versa). The HIGH and LOW voltage levels of the bitlines are the complimentary metal-oxide semiconductor (CMOS) voltage levels (either 0V or Vdd) after the corresponding sense amplifier SA has amplified the sensing signal.

For high density DRAMs, such as 256 Mb DRAMs and greater, a sense amplifier SA is shared between an array located above the sense amplifier and another array located below the sense amplifier. This is a common approach to reduce the number of sense amplifiers SAs and, thus, reduce the DRAM chip size. To relax the layout pitch of the sense amplifiers SAs, the sense amplifiers SAs are arranged in an alternating manner.

The accessing of memory cell data bits in the second array 102n will now be described with respect to FIGS. 1 and 2. FIG. 2 is a timing diagram illustrating the state of some of the signals of the DRAM 100 of FIG. 1 during an access operation of memory cell data bits. In a standby state, the bitlines BLs are equalized by an NMOS transistor 144 and precharged at ½VDD level. MUXn+1b, MUXnt, MUXnb, and MUXn−1t are bitline multiplexer control signals, where n indicates the which array, and t and b indicate the top or the bottom of that array, respectively. In a standby condition, all bitline multiplexer control signals (i.e. MUXn+1b, MUXnt, MUXnb, and MUXn−1t) are HIGH. Accordingly, the nodes SA and $\overline{\text{SA}}$ in the sense amplifier SA are coupled to the bitlines BL and $\overline{\text{BL}}$, respectively, in the second array 102n through bitline multiplexer NMOS transistor pair 132, 134. Further, the nodes SA and $\overline{\text{SA}}$ in the sense amplifier SA are coupled to the bitlines BL and $\overline{\text{BL}}$, respectively, in the third array 102n−1 through bitline multiplexer NMOS transistor pair 136, 138.

When the second array 102n is activated, the equalizer signal EQ goes LOW. To isolate the bitlines BLs in the first and third arrays (102n+1 and 102n−1, respectively) from the bitlines BLs in the second array 102n, the bitline multiplexer control signals MUXn+1b and MUXn−1t go LOW, while any other bitline multiplexer control signals, including MUXnt and MUXnb, remain HIGH. This is because only the multiplexers adjacent to the accessed array need be controlled. All other multiplexers (including those for arrays not shown) may be placed in a standby state, by putting their bitline multiplexer control signals HIGH.

A wordline WL in the second array 102n then rises, and a data bit in the corresponding capacitor $C_S$ is read out to the corresponding bitline BL in the second array 102n through the corresponding NMOS transistor 110 coupled to the wordline WL. A CMOS cross-coupled sense amplifier SA (comprised of NMOS transistors 128 and 130 and PMOS transistors 120 and 122) is then activated. More particularly, the NMOS sense amplifier enable signal NSA and the PMOS sense amplifier enable signal PSA go HIGH and LOW, respectively. This makes the NMOS transistor 150 and the PMOS transistor 124 turn ON, amplifying the voltage of each bitline pair.

The column select line signal CSL rises, coupling the selected BL pair to the data line pair (DL and $\overline{\text{DL}}$) through the column switch NMOS transistors (140 and 142). In this example, the column select line signal CSL remains LOW. The amplified voltage on the bitlines BLs are written back to the capacitor $C_S$ of the corresponding memory cells. In a reset phase, the equalizer signal EQ, and the bitline multiplexer control signals MUXn+1b and MUXn−1t go HIGH, equalizing all the bitlines BLs. This naturally precharges the bitlines BLs at the 2Vdd level in a standby state.

Correct operation of the DRAM is strongly dependent upon a reliable sensing operation. Nonetheless, there are several factors that cause sensing failures. Some of these factors include: (1) a small cell capacitance $C_S$; (2) a large bitline capacitance $C_{BL}$; (3) capacitance mismatch of a bitline pair; (4) threshold voltage mismatch of the cross-coupled devices; and (5) bitline-to-bitline coupling noise.

Accordingly, there is a need for a method and apparatus which determines the sensing margin of the sense amplifiers SAs in a semiconductor memory. The sensing margin is the minimum detectable voltage difference that a sense amplifier can detect (its sensitivity). Moreover, there is a need for a method and apparatus which identifies existing problems in semiconductor memories. Further, there is a need for a method and apparatus which enables the testing of semiconductor memories.

SUMMARY OF THE INVENTION

The problems stated above, as well as other related problems of the prior art, are solved by the present invention, a semiconductor memory with programmable bitline multiplexers.

According to a first aspect of the invention, there is provided a semiconductor memory device. The semiconductor memory device includes: a plurality of memory cells arranged in at least two groups; at least one sense amplifier; a first and a second multiplexer; and at least one programmable control device. Each multiplexer is adapted to couple at least one of the groups to the amplifier. The programmable control device is adapted to control the first and said second multiplexers.

According to a second aspect of the invention, the programmable control device is adapted to control the multiplexers independently.

According to a third aspect of the invention, the programmable control device is further adapted to output at least one control signal for controlling at least one multiplexer.

According to a fourth aspect of the invention, the programmable control device is adapted to control the multiplexers based on predetermined address vectors.

According to a fifth aspect of the invention, the programmable control device is further adapted to engage the semiconductor memory in a test mode upon receiving a test mode command, and to control at least one of the multiplexers upon receiving a function set command.

According to a sixth aspect of the invention, the function set command comprises an address vector that identifies at least one of the multiplexers and at least one function corresponding thereto.

According to a seventh aspect of the invention, the at least one programmable control device is adapted to control at least one of the multiplexers to always be ON or OFF.

According to an eighth aspect of the invention, the at least one programmable control device is adapted to control a timing of at least one of a set phase and a reset phase of at least one of the multiplexers.

According to a ninth aspect of the invention, the at least one programmable control device is adapted to control a voltage of a control signal corresponding to at least one of the multiplexers.

According to a tenth aspect of the invention, the at least one programmable control device is adapted to set at least one control signal corresponding to at least one of the multiplexers to at least one predetermined condition.

According to an eleventh aspect of the invention, the at least one programmable control device is further adapted to invert at least one control signal corresponding to at least one of the multiplexers.

According to a twelfth aspect of the invention, the first and second multiplexers respectively couple a first bitline and a corresponding reference bitline to the sense amplifier independently.

According to a thirteenth aspect of the invention, the first and second multiplexers respectively couple a first bitline in one of the two groups and a second bitline in the other group to the sense amplifier, to provide an open bitline architecture.

According to a fourteenth aspect of the invention, at least one programmable control device independently controls each bitline in a bitline pair.

According to a fifteenth aspect of the invention, the at least one programmable control device independently controls every other bitline pair.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to a semiconductor memory with programmable bitline multiplexers. It is to be appreciated that while the present invention may be used for normal memory operations (e.g., read, write), it is particularly suited for test purposes. For example, the present invention may be used to test the sensing margin of a given sense amplifier, as well as many other operating parameters of the semiconductor memory, some of which are described below. Advantageously, the bitline multiplexers are programmed by predetermined address vectors, thereby affording significant flexibility in testing the bitlines.

Figure 1:
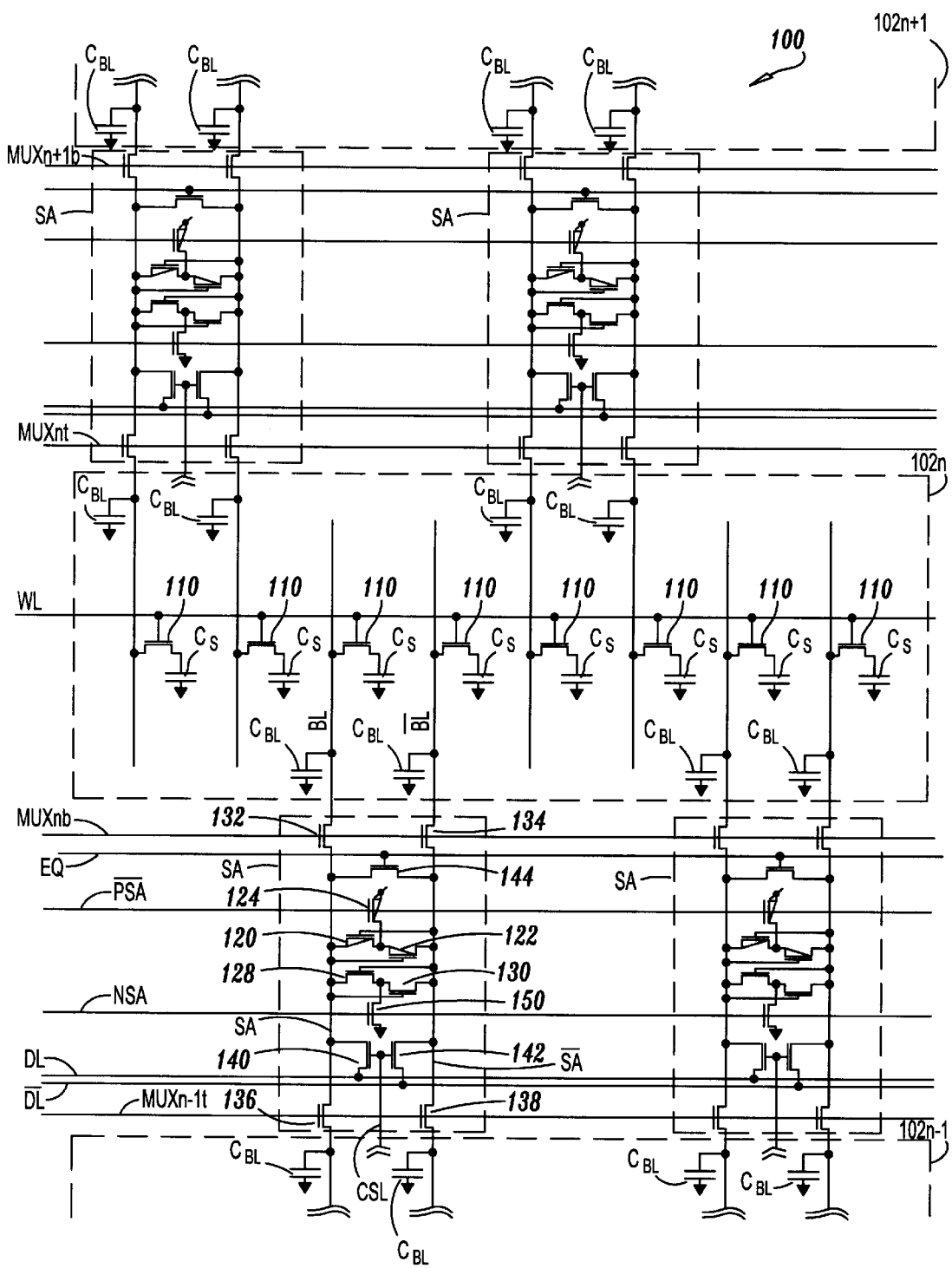
FIG. 1 is a dynamic random access memory (DRAM) 100 having a typical structure according to the prior art.
Figure 3:
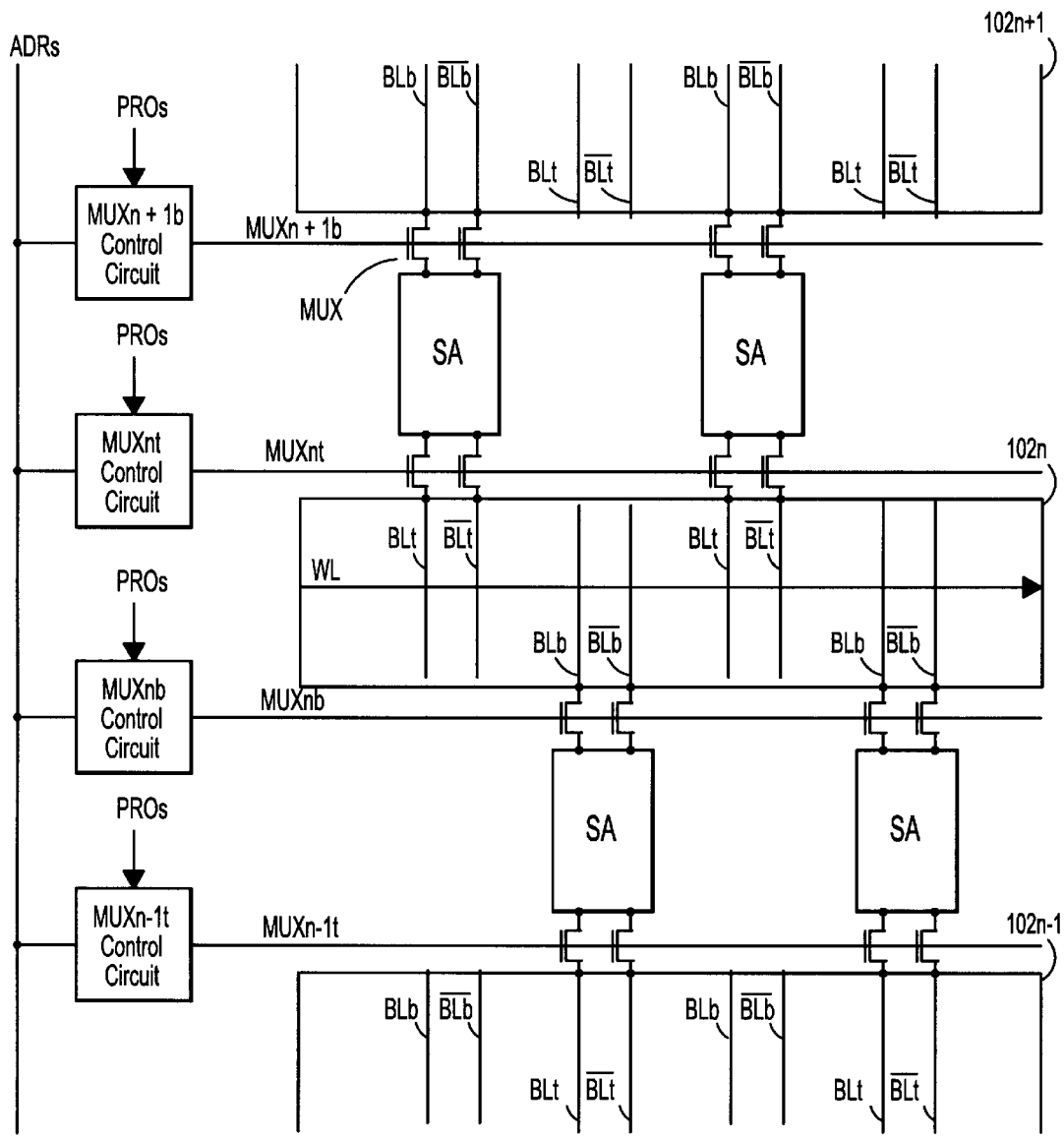
FIG. 3 is a diagram of a dynamic random access memory (DRAM) 300 according to an illustrative embodiment of the present invention.

FIG. 3 is a diagram of a dynamic random access memory (DRAM) 300 according to an illustrative embodiment of the present invention. FIG. 3 is intended to represent a DRAM similar to that shown in FIG. 1, with some differences. The primary difference between the DRAMs of FIGS. 1 and 3 is the inclusion of the multiplexer control circuits (MUXn+1b control circuit, MUXnt control circuit, MUXnb control circuit, MUXn−1t control circuit) in FIG. 3. The basic concept of the invention is to flexibly program the bitline multiplexer control signals (MUXn+1b, MUXnt, MUXnb, and MUXn−1t) in a test mode. By flexibly programming the bitline multiplexer control signals, a sensing condition can be varied so as to determine a sensing margin and the cause of a sensing failure.

The bitline multiplexer control signals (MUXn+1b, MUXnt, MUXnb, MUXn−1t) are controlled by the corresponding multiplexer control circuits (MUXn+1b control circuit, MUXnt control circuit, MUXnb control circuit, MUXn-1t control circuit, respectively). The multiplexer control circuits control the functions of the bitline multiplexer control signals according to address inputs, as described more fully hereinbelow. The function of the multiplexer control circuits can be changed by the programming signal PROs.

Figure 4:
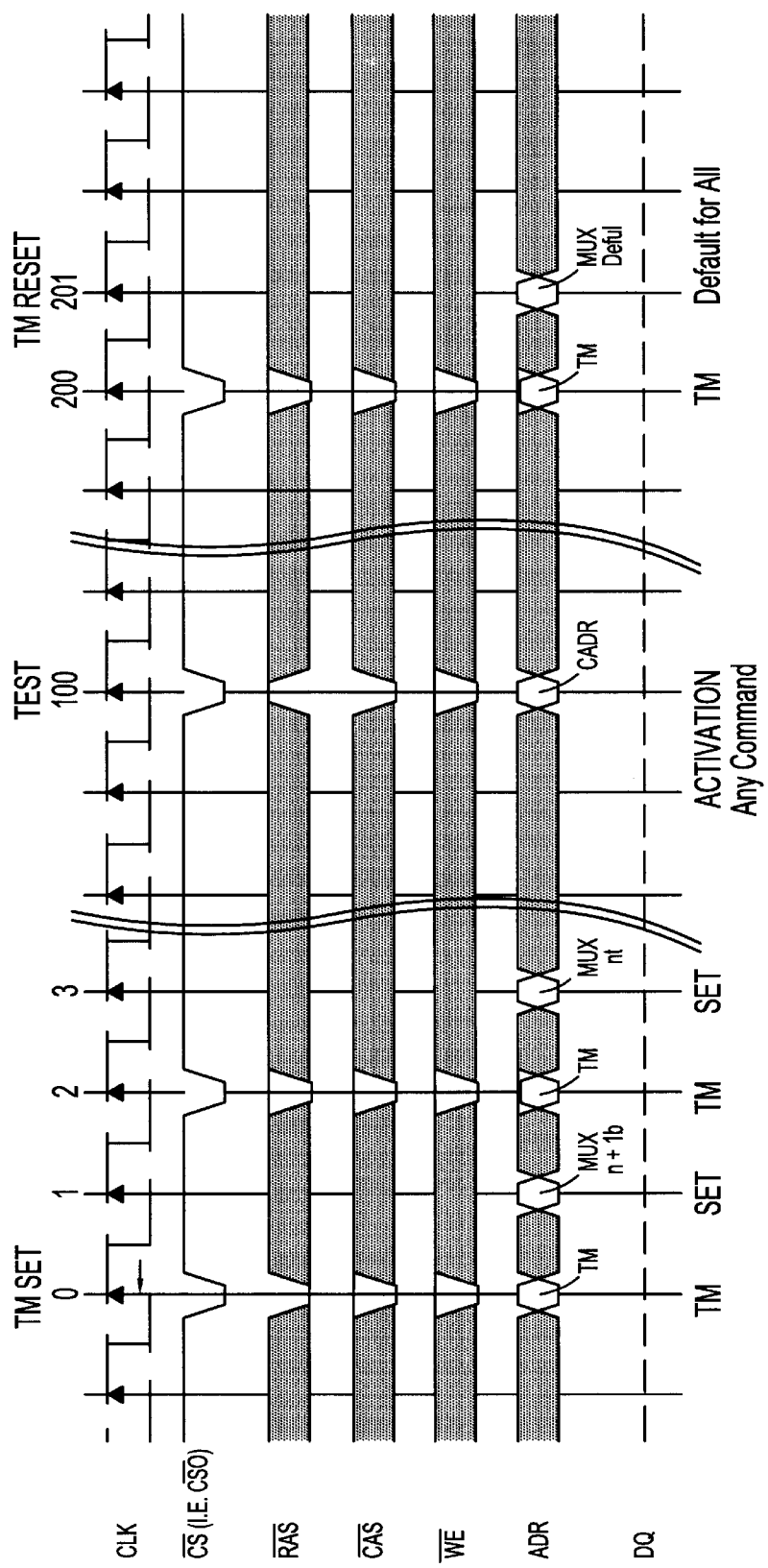
FIG. 4 is a timing diagram corresponding to a test mode for a synchronous dynamic random access memory (SDRAM) according to an illustrative embodiment of the present invention.

FIG. 4 is a timing diagram corresponding to a test mode for a synchronous dynamic random access memory (SDRAM) according to an illustrative embodiment of the present invention. Each bitline multiplexer control signal is programmed by the following two consecutive protocols: a test mode command; and a function set command. The test mode command is enabled when a predetermined address vector TM is provided concurrent with a chip select signal CS, a row address strobe signal RAS, a column strobe signal CAS, and a write enable signal $\overline{WE}$ all being LOW, at the leading edge of the clock signal CLK. When the test mode command is enabled, the bitline test mode is engaged, and the chip accepts the function set command at the next clock pulse. The function set command corresponds to an address vector that is accepted at the next leading edge of the clock signal CLK. The function set determines the bitline control function of a corresponding multiplexer. The designation "DQ" in FIG. 4 represents the data port of the DRAM in which data is written to, or read from. The test mode can be enabled (TM SET) or disabled (TM RESET) regardless of the condition of the DQ port. During testing of the DRAM (TEST), the DQ port should be controlled so that the data can be written to, or read from, the DRAM. In FIG. 4, the read mode and write mode are not shown and, therefore, the DQ port maintains a tri-state.

It is to be appreciated that each multiplexer can be programmed differently by applying a plurality of test mode commands to corresponding clock phases. FIG. 4 illustrates the command protocol of the SDRAM to program multiplexer functions. In this example, it is presumed that a test mode is enabled at clock phase 0, and a multiplexer fs) and corresponding function are determined at clock phase 1. The identity of the multiplexer(s) and the function of the multiplexer is determined by the address vector input at the second leading edge of the clock signal CLK of FIG. 4 (the test mode having been engaged at the first leading edge of the clock signal CLK). TABLE 1 illustrates the details of the address vector containing 16 address ADR bits (0 through 15). To program a different multiplexer (or the same multiplexer a different function), the test mode command is again applied at clock phase 2, and the function set command is applied at clock phase 3.

TABLE 1

| ADR | FUNCTION |
|-----|----------|
| 0 | MUX control signal ON |
| 1 | MUX control signal OFF |
| 2 | SET Early |
| 3 | SET Delay |
| 4 | RESET Early |
| 5 | RESET Delay |
| 6 | Increase the ON Voltage |
| 7 | Decrease the ON Voltage |
| 8 | Default A |
| 9 | Default B |
| 10 | Inverted |
| 11 | Set Default |
| 12 | Set Default All MUX |
| 13–15 | MUX control signal ID |

Figure 5:
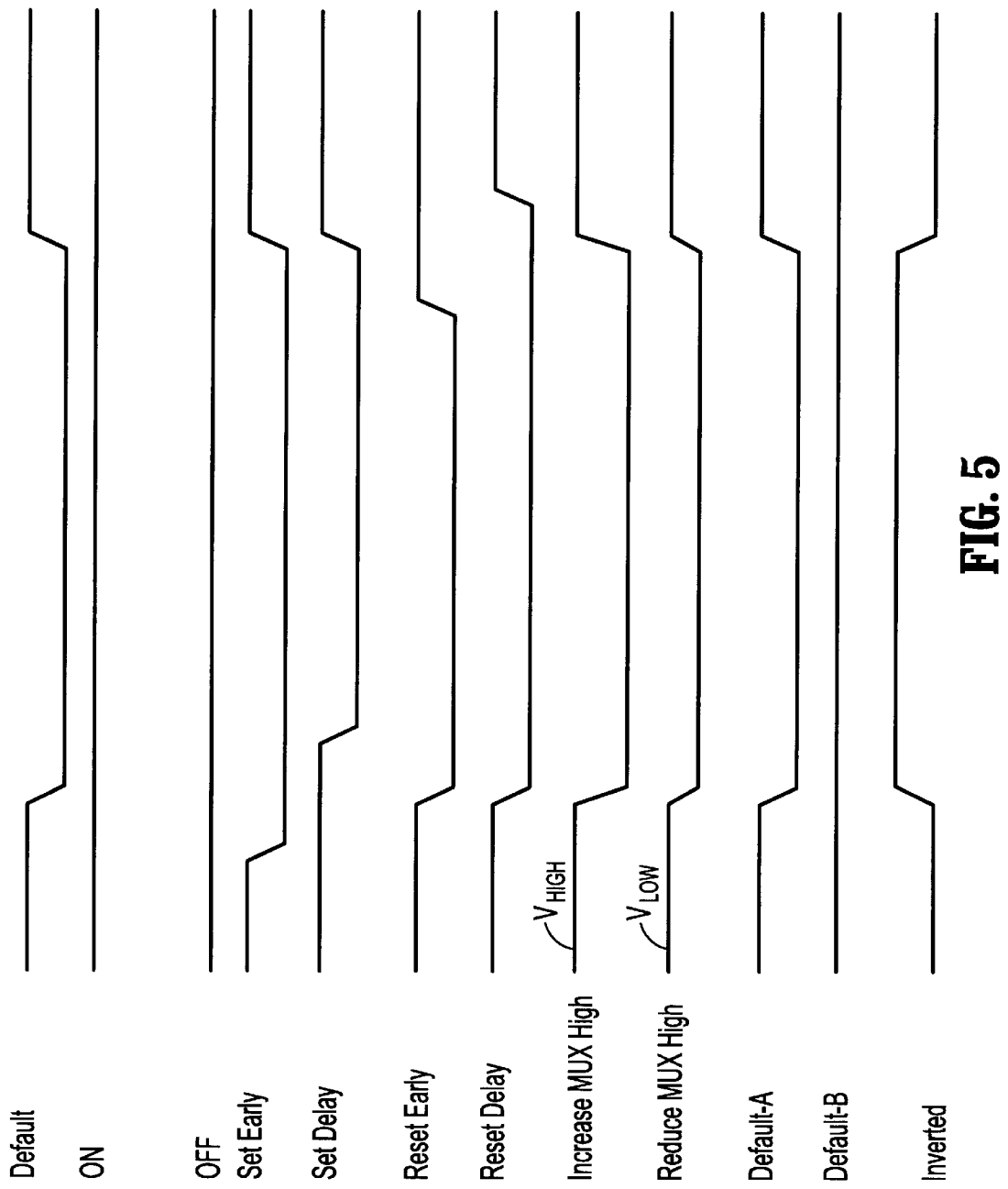
FIG. 5 illustrates the corresponding multiplexer waveforms programmed by a test mode command followed by a function set command with the address vector, according to an illustrative embodiment of the present invention.

FIG. 5 illustrates the corresponding multiplexer waveforms programmed by a test mode command followed by a function set command with the address vector, according to an illustrative embodiment of the present invention. Addresses ADR's 13, 14, and 15 identify the multiplexer Go be programmed. In this example, up to eight multiplexers can be programmed, by using three address bits. However, additional bits may be included so that more than eight multiplexers can programmed at a given time.

Figure 2:
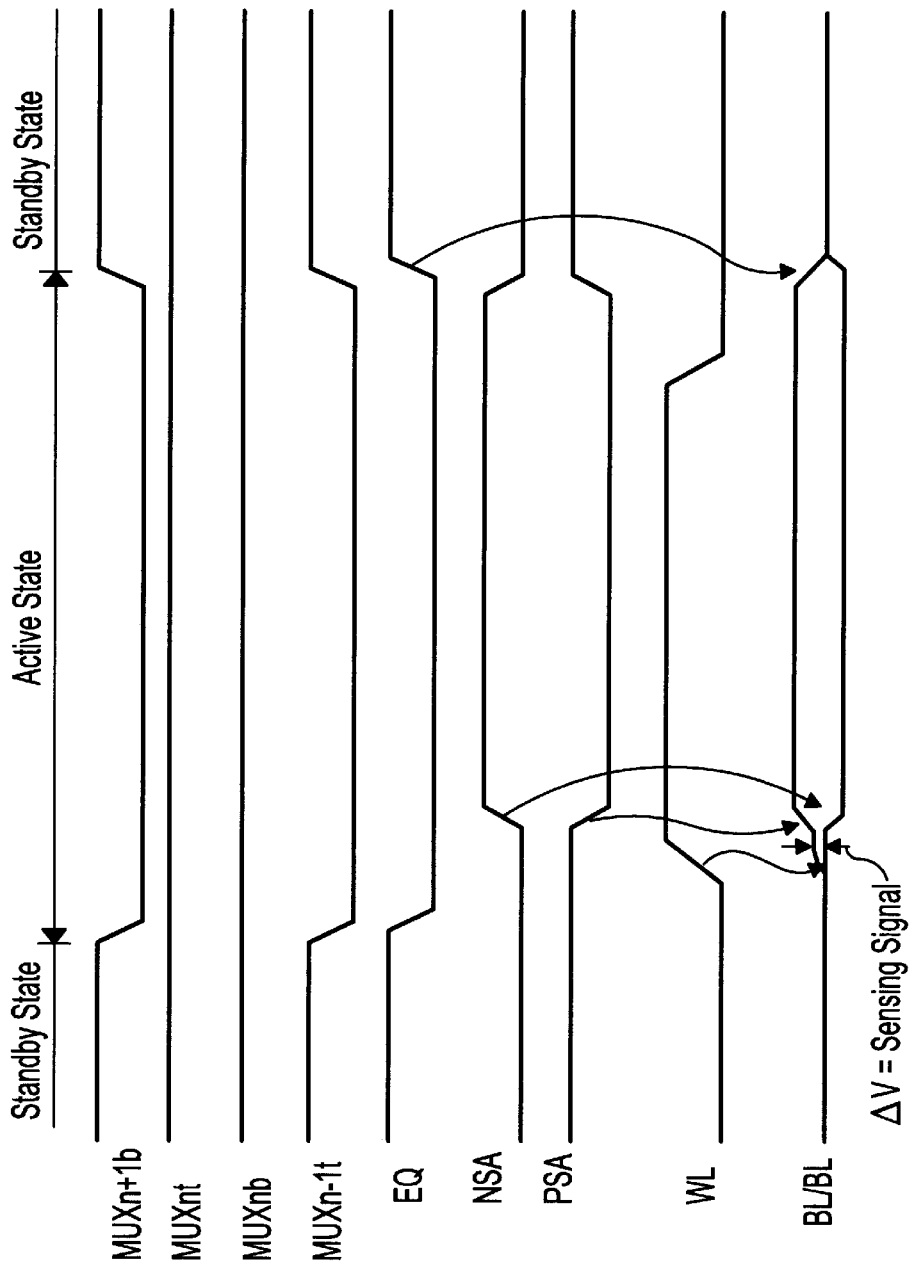
FIG. 2 is a timing diagram illustrating the state of some of the signals of the DRAM 100 of FIG. 1 during an access operation of memory cell data bits.

Addresses ADR's 0 and 1 turn the bitline multiplexer control signal ON or OFF, respectively. Addresses ADR's 2 and 3 change the timing of the multiplexer set phase. Addresses ADR's 4 and 5 change the timing of the bitline multiplexer control signal reset phase. Addresses ADR's 6 and 7 change the bitline multiplexer control signal high voltage. Addresses ADR's 8 and 9 set the bitline multiplexer control signal for predetermined default conditions A and B, respectively (similar to the bitline multiplexer control signals MUXn+1b and MUXnt, respectively, in FIG. 2). Address ADR 10 inverts the bitline multiplexer control signal. Address ADR 11 resets a bitline multiplexer control signal to a corresponding predetermined default condition. Address ADR 12 resets all bitline multiplexer control signals to a corresponding predetermined default condition.

Figure 6:
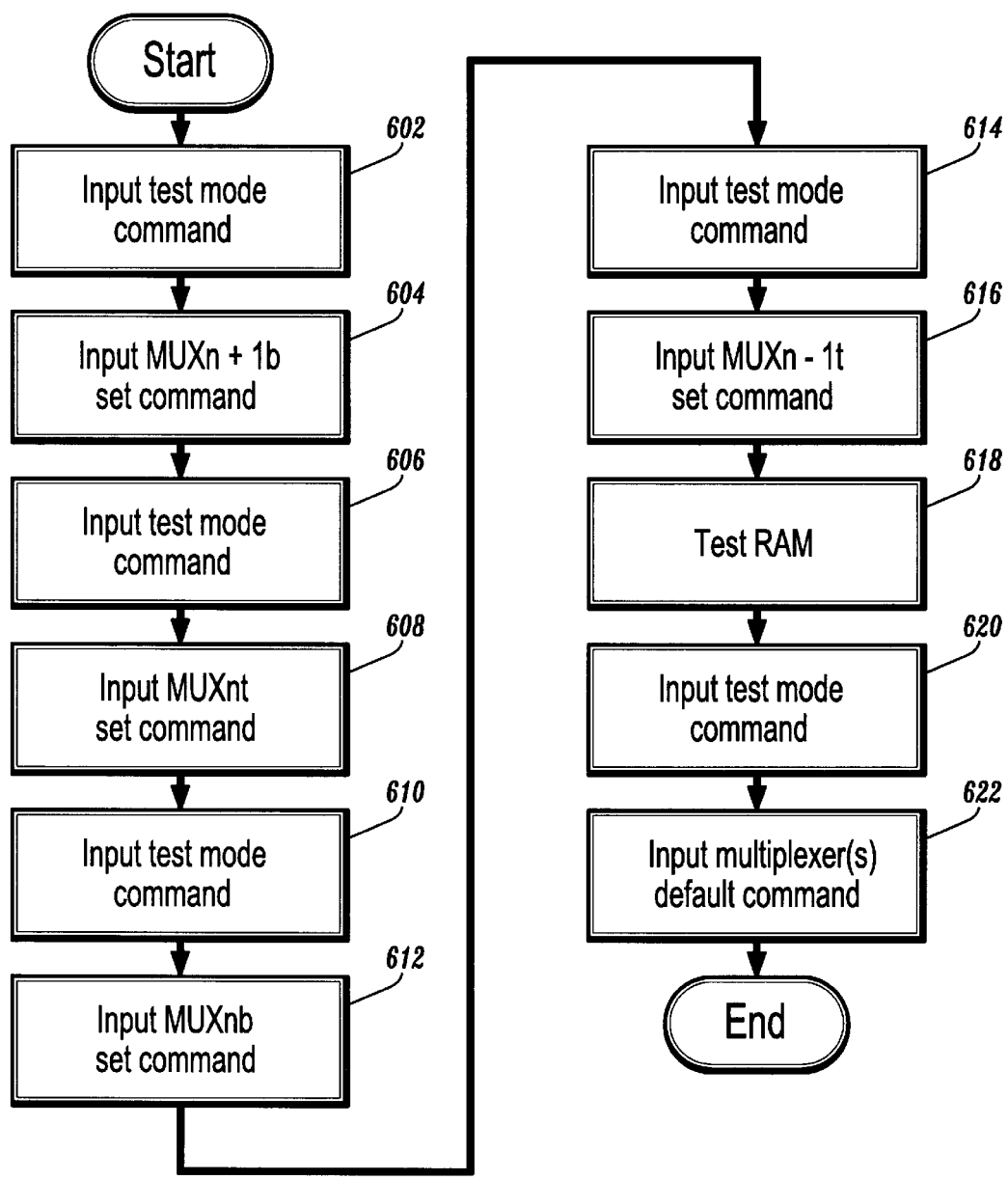
FIG. 6 is a flow diagram illustrating a method for programming multiplexers according to an illustrative embodiment of the present invention.

FIG. 6 is a flow diagram illustrating a method for programming multiplexers according to an illustrative embodiment of the present invention. In general, each of the multiplexer control signals are sequentially set by applying a plurality of commands sets comprising a test mode command and a function set command. Several bitline multiplexer control signals can be stacked by setting two or more bits in the address vector shown in Table 1 for each multiplexer. This produces over 1000 bitline multiplexer control patterns for all of the multiplexers. After the bitline multiplexer control signals of all of the multiplexers have been programmed, the multiplexer control signals can be disabled by controlling either address ADR 11 for each multiplexer or address ADR 12 for all multiplexers simultaneously.

According to the method of FIG. 6, the test mode command is input to place the chip in a bitline test mode (step 602). The predetermined address vector TM is then input to select the bitline multiplexer control signal MUXn+1b and a corresponding function (step 604). The test mode command is again input to place the chip in a bitline test mode (step 606), and the predetermined address vector TM is then input to select the bitline multiplexer control signal MUXnt and a corresponding function (step 608). The test mode command is again input to place the chip in a bitline test mode (step 610), and the predetermined address vector TM is then input to select the bitline multiplexer control signal MUXnb and a corresponding function (step 612). The test mode command is again input to place the chip in a bitline test mode (step 614), and the predetermined address vector TM is then input to select the bitline multiplexer control signal MUXn+1t and a corresponding function (step 616).

After the predetermined address vectors TMs have been input for all of the bitline multiplexer control signals to be tested, the DRAM is tested to verify the sensing margin (step 618). The test mode command is again input to place the chip in a bitline test mode (step 620). Then, the predetermined address vector TM is input to reset one (address 11) or all (address 12) of the bitline multiplexer control signals (step 622).

FIGS. 7 through 13 are timing diagrams corresponding to various test modes of a dynamic random access memory. It is to be appreciated that the equalizer signal EQ, the NMOS sense amplifier enable signal NSA, the PMOS sense amplifier enable signal PSA, and the wordline signal WL, remain the same in FIGS. 7 through 13 and, thus, are not referenced in the description of each of those figures. Sensing signal pairs BLt & $\overline{BLt}$ and BLb & $\overline{BLb}$ change in accordance with the programmed function.

Figure 7:
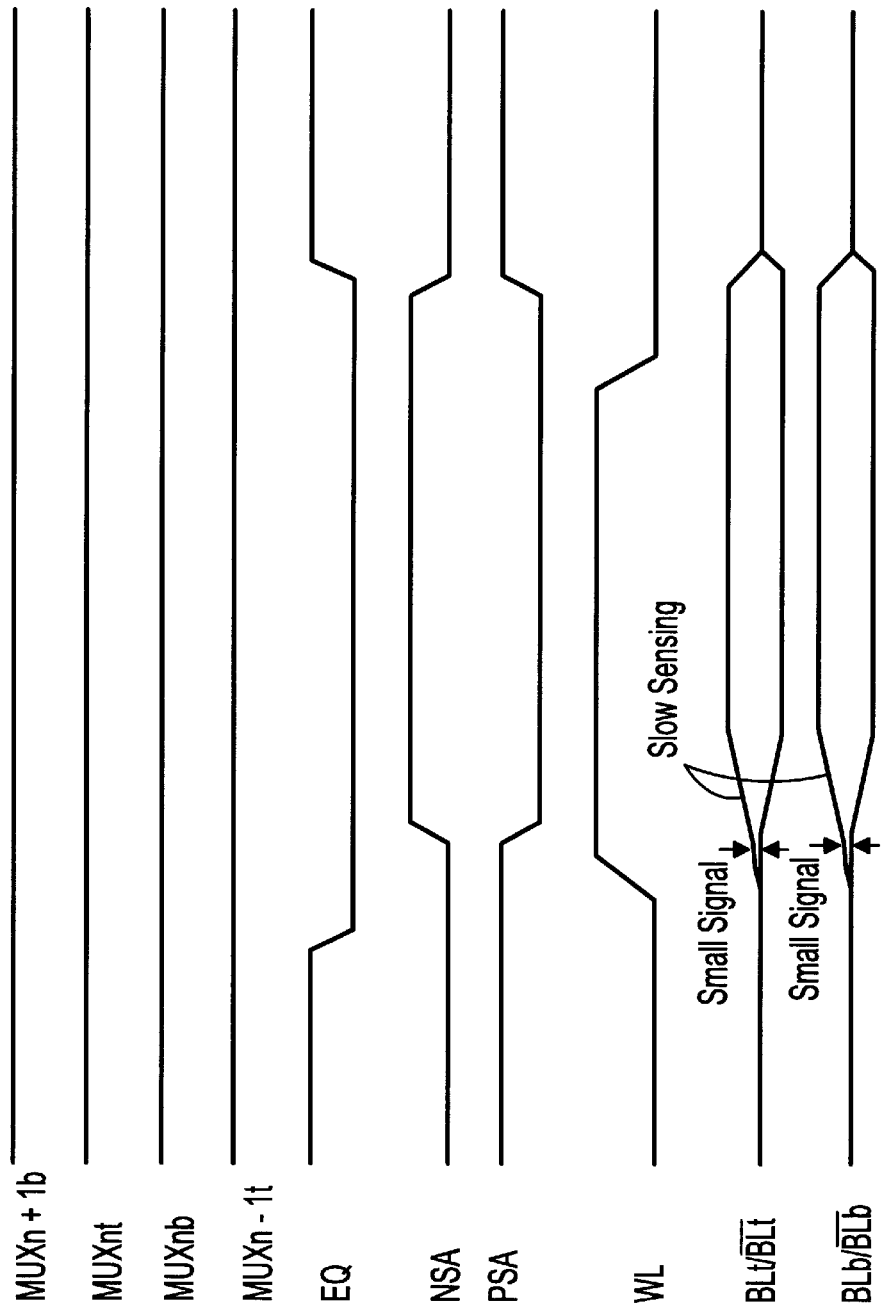
FIG. 7 is a timing diagram corresponding to the semiconductor memory having all of its multiplexers turned ON, according to an illustrative embodiment of the present invention.

FIG. 7 is a timing diagram corresponding to the semiconductor memory having all of its multiplexers turned ON, according to an illustrative embodiment of the present invention. This mode can be realized by setting the address to 0 for each multiplexer. In this mode, the bitline multiplexer control signals MUXn+1b, MUXnt, MUXnb, and MUXn−1t are all HIGH, and a given sense amplifier SA simultaneously supports two bitline pairs in two arrays. The bitline capacitance $C_{BL}$ is doubled, thus reducing the sensing signal to $\frac{1}{2}Vdd \times C_S/(C_S+2C_{BL})$. Note that the sensing signal of FIG. 7 is smaller than the sensing signal of FIG. 2. Note that the sensing speed shown in FIG. 7 is slower than the sensing speed shown in FIG. 2. It is to be appreciated that this mode allows the sensing margin to be determined with respect to the bitline capacitance $C_{BL}$.

Figure 8:
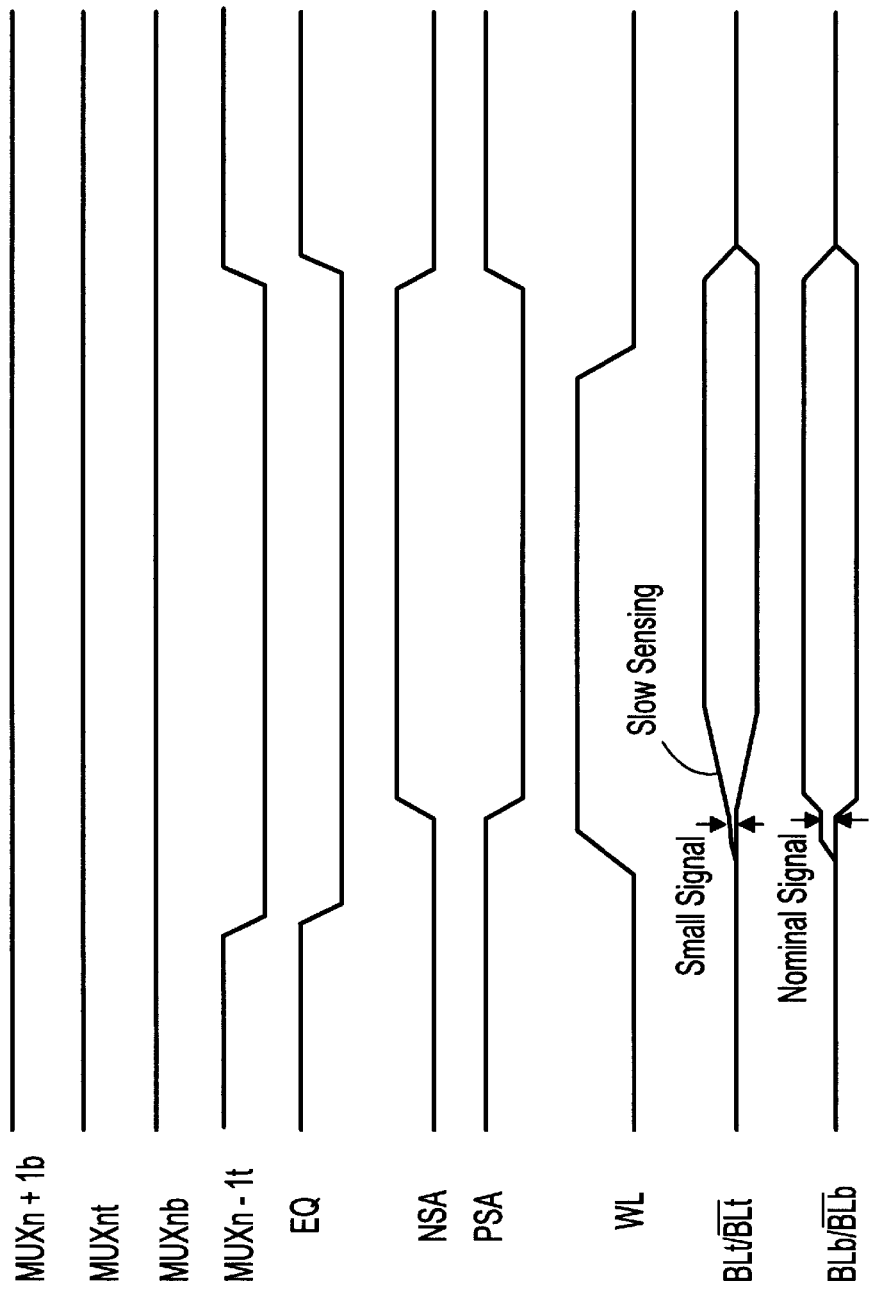
FIG. 8 is a timing diagram corresponding to the semiconductor memory having the bitline multiplexer control signal MUXnb turned ON, according to an illustrative embodiment of the present invention.

FIG. 8 is a timing diagram corresponding to the semiconductor memory having the bitline multiplexer control signal MUXn+1 turned ON, according to an illustrative embodiment of the present invention. This mode can be realized by setting the address to 0 for only MUXn+1. In this mode, every other sense amplifier is coupled to two bitline pairs in two arrays. Note that every other sense amplifier still supports one bitline pair. Thus, this artificially generates a bitline capacitance that is different for every other bitline pair. In particular, the bitline capacitance $C_{BL}$ is doubled for every other bitline pair. It can be presumed that the sensing signal of the bitline BLt pair supported by MUXn+1 is smaller than the sensing signal for the other bitline BLb pair, thus changing the sensing speed of the other bitline pair. It is to be appreciated that this mode allows for determining the bitline coupling effect between fast-swing bitlines BLb pairs and slow-swing bitlines BLt pairs during multiplexer control signal development and sensing.

Figure 9:
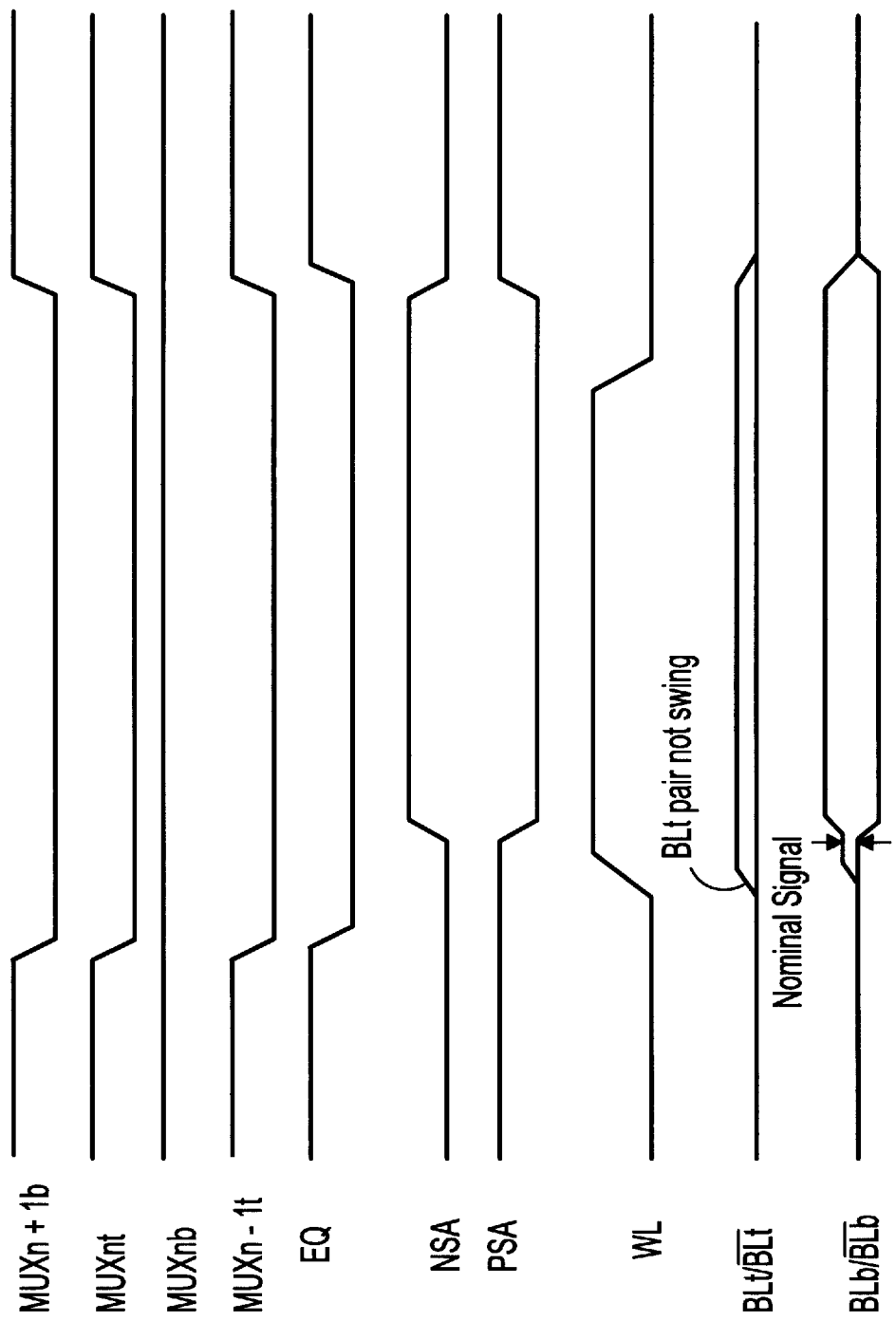
FIG. 9 is a timing diagram corresponding to the semiconductor memory having the bitline multiplexer control signal MUXnt set to the default A condition, according to an illustrative embodiment of the present invention.

FIG. 9 is a timing diagram corresponding to the semiconductor memory having the bitline multiplexer control signal MUXnt set to the default A condition, according to an illustrative embodiment of the present invention. This mode can be realized by setting the address to 8 for MUXnt. By disabling MUxnb before the determination of the sensing margin, every other bitline pair (BLt and $\overline{BLt}$) coupled to the MUXnt does not swing. Note that the other bitline pairs (BLb & $\overline{BLb}$) can swing as in a normal mode. This mode eliminates the bitline-to-bitline coupling effect for every bitline pair, this isolating a possible bitline coupling problem. It is to be appreciated that this mode allows for determining the bitline coupling effect.

Figure 10:
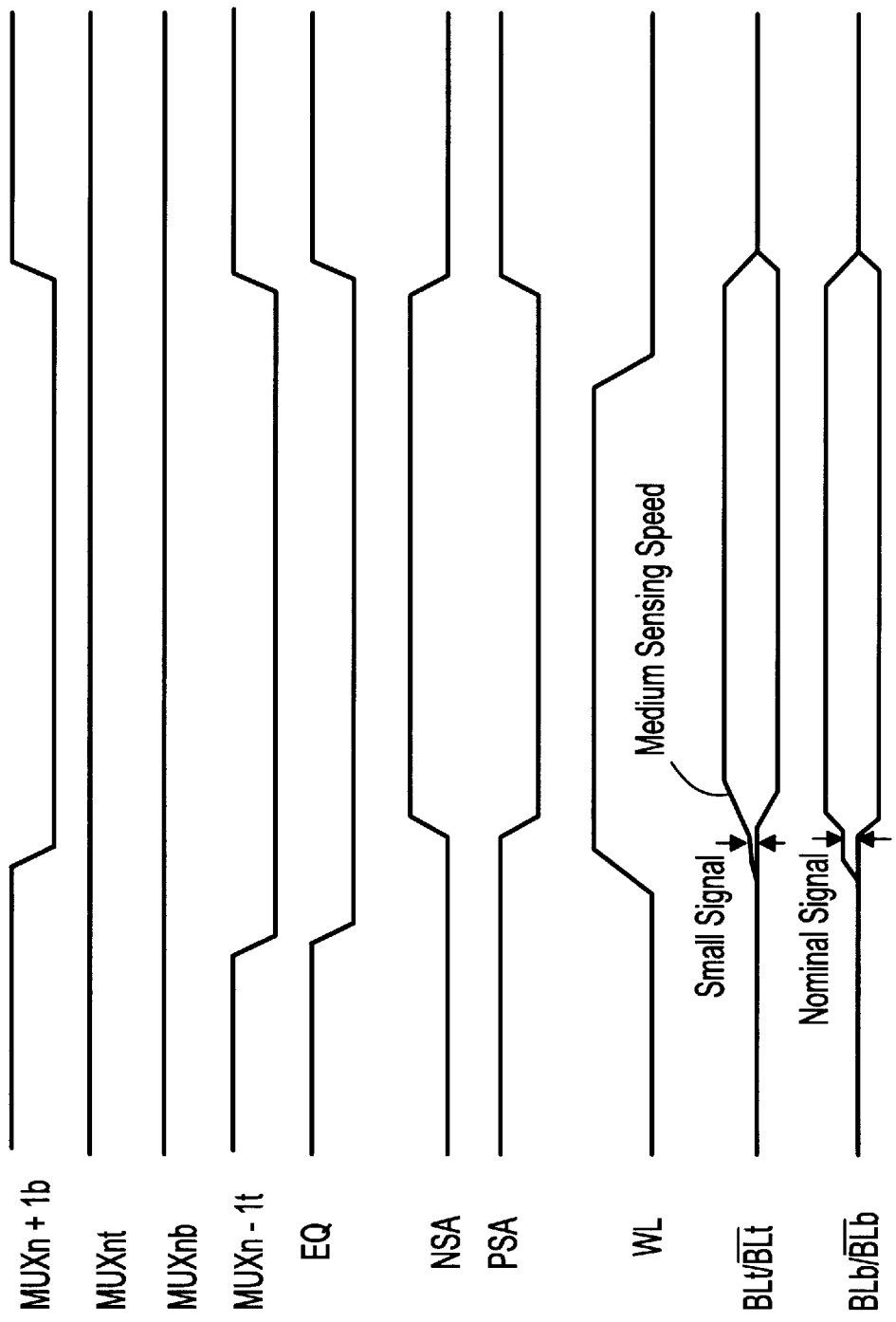
FIG. 10 is a timing diagram corresponding to the semiconductor memory having the bitline multiplexer control signal MUXn+1b delayed, according to an illustrative embodiment of the present invention.

FIG. 10 is a timing diagram corresponding to the semiconductor memory having the bitline multiplexer control signal MUXn+1b delayed, according to an illustrative embodiment of the present invention. This mode can be realized by setting the address to 3 for MUXn+1b. Unlike the previous examples, this mode maintains the basic bitline multiplexer control signal; however, the switching time of the multiplexer control signal MUXn+1b is delayed. The sensing signal of every other bitline pair (BLt and $\overline{BLt}$) coupled to MUXn+1b is reduced to $\frac{1}{2}Vdd \times C_S/(C_S+2C_{BL})$. This condition is similar to that of FIGS. 7 and 8. However, the multiplexer control signal MUXn+1b is disabled before sensing starts, which is similar to the default condition. Thus, the bitline capacitance $C_{BL}$ during sensing can be similar to a conventional sensing operation. The sensing speed is slower than the conventional operation in FIG. 2 due to a small sensing signal, but faster than the sensing speed in FIGS. 7 and 8. Note that every other bitline pair (which is not coupled to MUXn+1b, e.g., BLb & $\overline{BLb}$) operates in the default condition, which has a larger sensing signal of $\frac{1}{2}Vdd \times C_S/(C_S+C_{BL})$. This simulates a condition of a bitline sensing operation having an insufficient sensing signal, and the bitline coupling effect to the adjacent bitline having a sufficient sensing signal. This condition typically occurs in the use of DRAMs. However, prior to the present invention, it has been difficult to simulate this condition for test purposes. It is to be appreciated that this mode allows for the identification of a weak cell with poor capacitance or a defective bitline BL.

Figure 11:
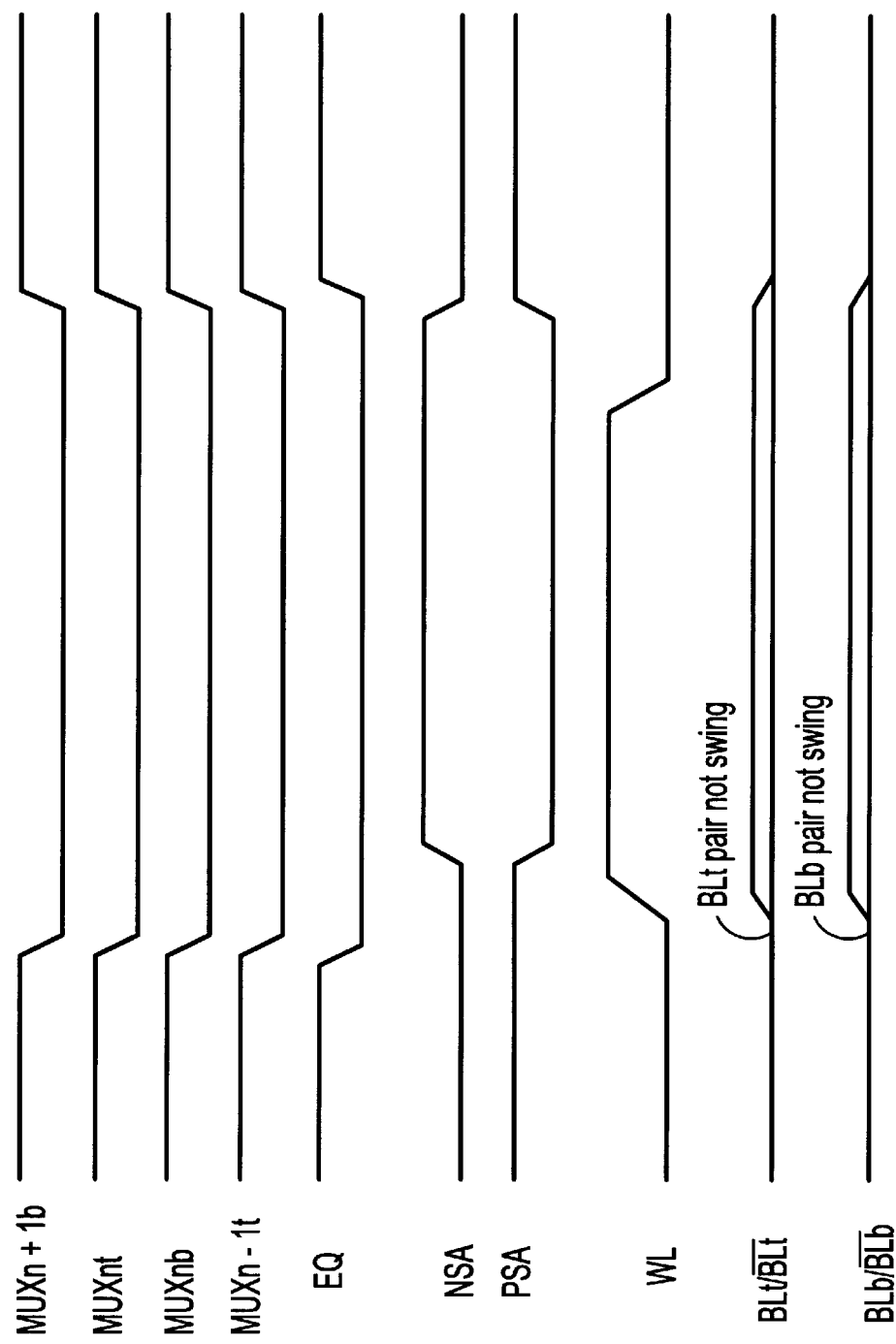
FIG. 11 is a timing diagram corresponding to the semiconductor memory having all of its multiplexers set to the default A function, according to an illustrative embodiment of the present invention.

FIG. 11 is a timing diagram corresponding to the semiconductor memory having all of its multiplexers set to the default A function, according to an illustrative embodiment of the present invention. This mode can be realized by setting the address to 8 for all of the multiplexers. The bitlines on any array can be isolated from the corresponding sense amplifier SA. It is to be appreciated that this mode allows for the determination of the current dissipation required for a given sense amplifier, while isolating the bitline restoring current. This is because of the condition where bitlines are isolated from the sensing operation and kept as a pre-charged condition. By subtracting the measured current from the current consumption in a conventional sensing operation, the current dissipation for only the bitline swing can be obtained. Note that the current consumption for the conventional sensing operation also includes a current for sense amplifiers. By eliminating the current for the sense amplifiers, the accuracy of a bitline capacitance measurement is increased.

Figure 12:
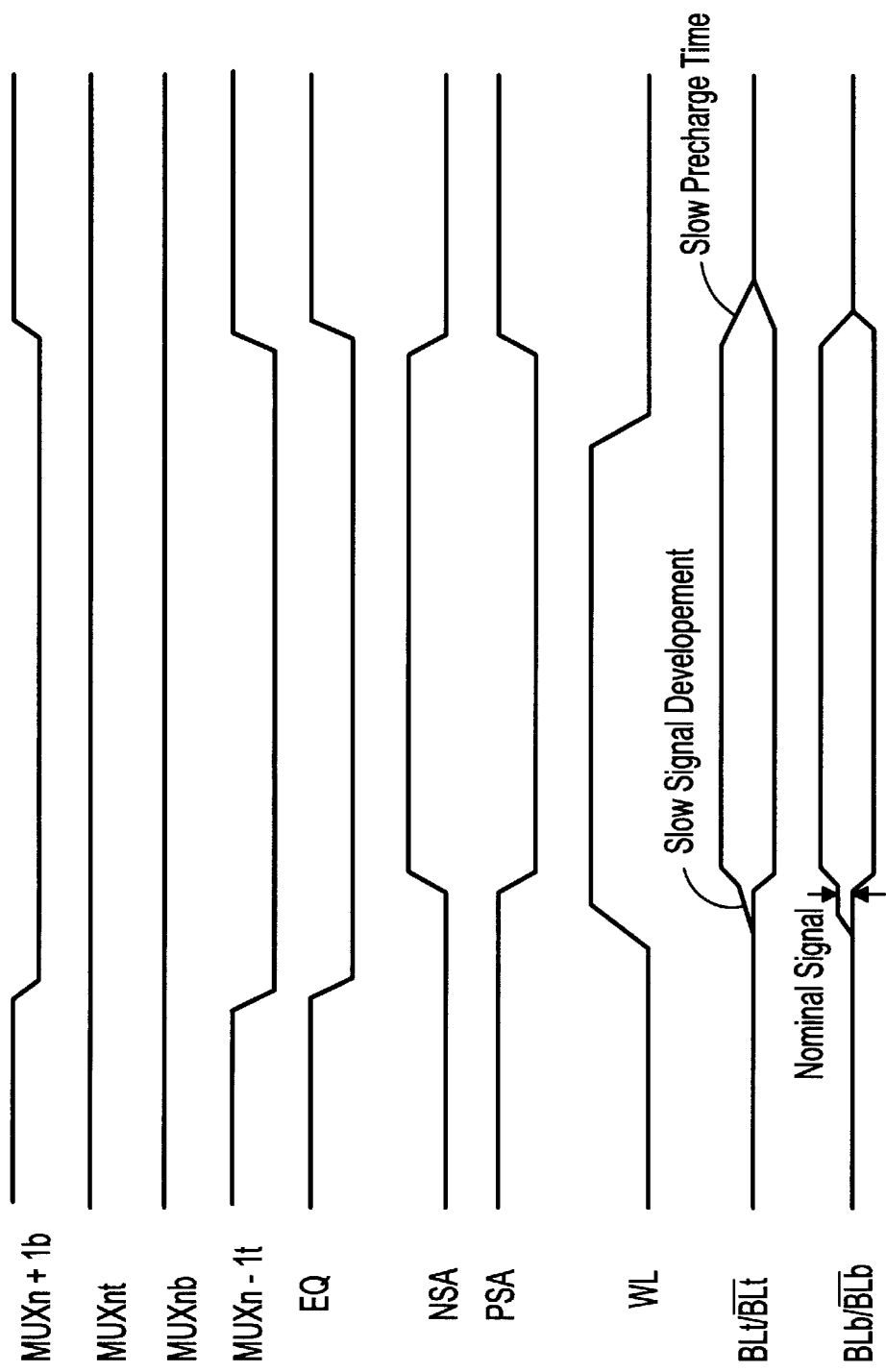
FIG. 12 is a timing diagram corresponding to the semiconductor memory having the high voltage of the bitline multiplexer control signal MUXn+1b reduced, according to an illustrative embodiment of the present invention.

FIG. 12 is a timing diagram corresponding to the semiconductor memory having the high voltage of the bitline multiplexer control signal MUXn+1b reduced, according to an illustrative embodiment of the present invention. This mode can be realized by setting the address to 7 for MUXn+1b. Reducing the MUXn+1b voltage reduces the bitline equalization speed for every other bitline pair in the first array 102n+1. This makes it possible to check the signal development speed, the sensing speed, and the restore speed of the bitline restore operation. Optionally, the MUXn+1b voltage can be increased by setting the address to 6, which accelerates the signal development speed, the sensing speed, and the restore speed.

Figure 13:
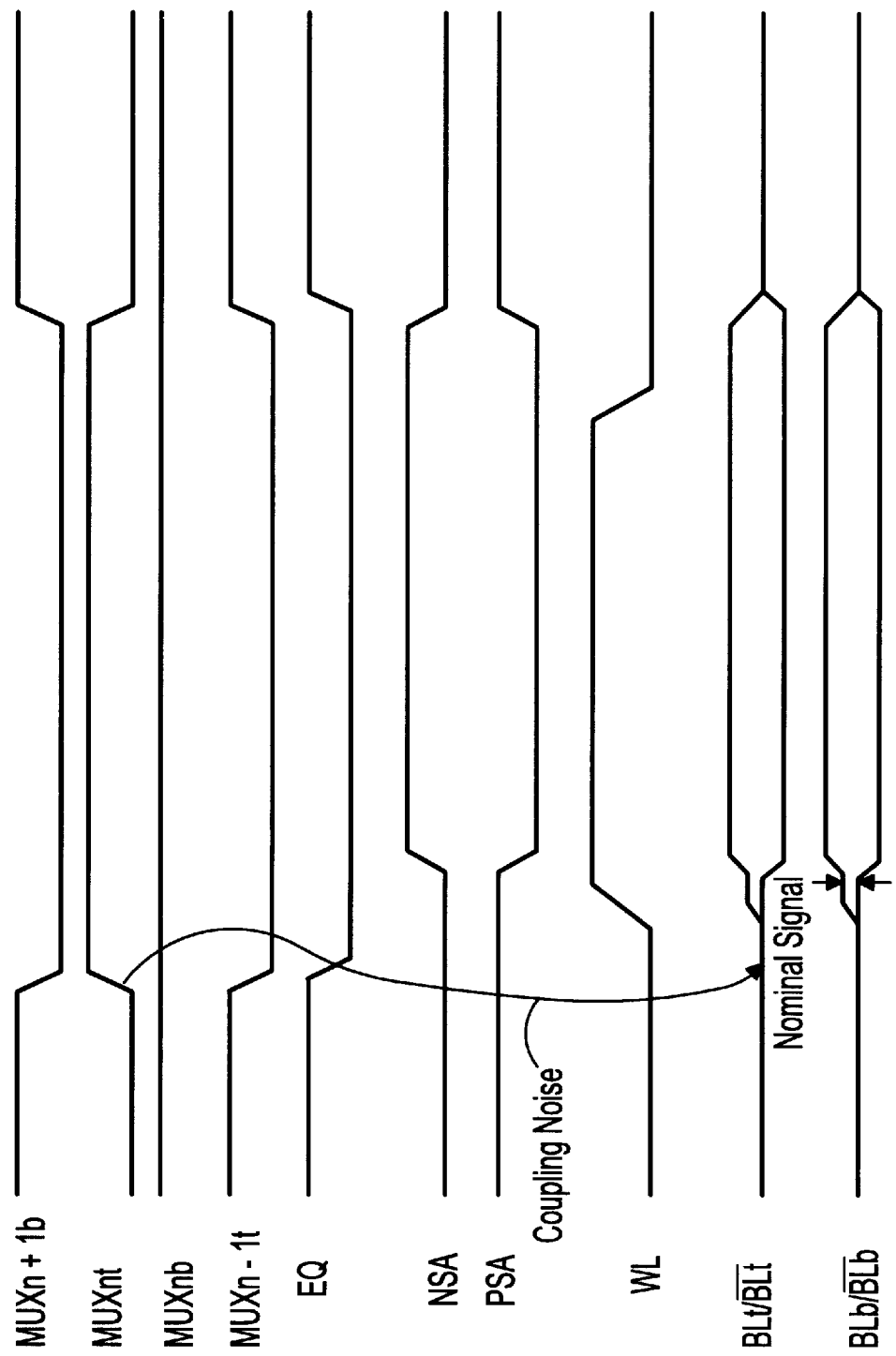
FIG. 13 is a timing diagram corresponding to the semiconductor memory having the bitline multiplexer control signal MUXnt inverted, according to an illustrative embodiment of the present invention.

FIG. 13 is a timing diagram corresponding to the semiconductor memory having the bitline multiplexer control signal MUXnt inverted, according to an illustrative embodiment of the present invention. This mode can be realized by setting the address to 10 for MUXnt. By inverting the bitline multiplexer control signal MUXnt every other bitline pair (BLt and $\overline{BL}t$) coupled to MUXnt goes HIGH for a short time due to the coupling effect between the bitlines and the multiplexers. It is to be appreciated that this mode enables the checking of the bitline BL and multiplexer MUX coupling effect.

Figure 14:
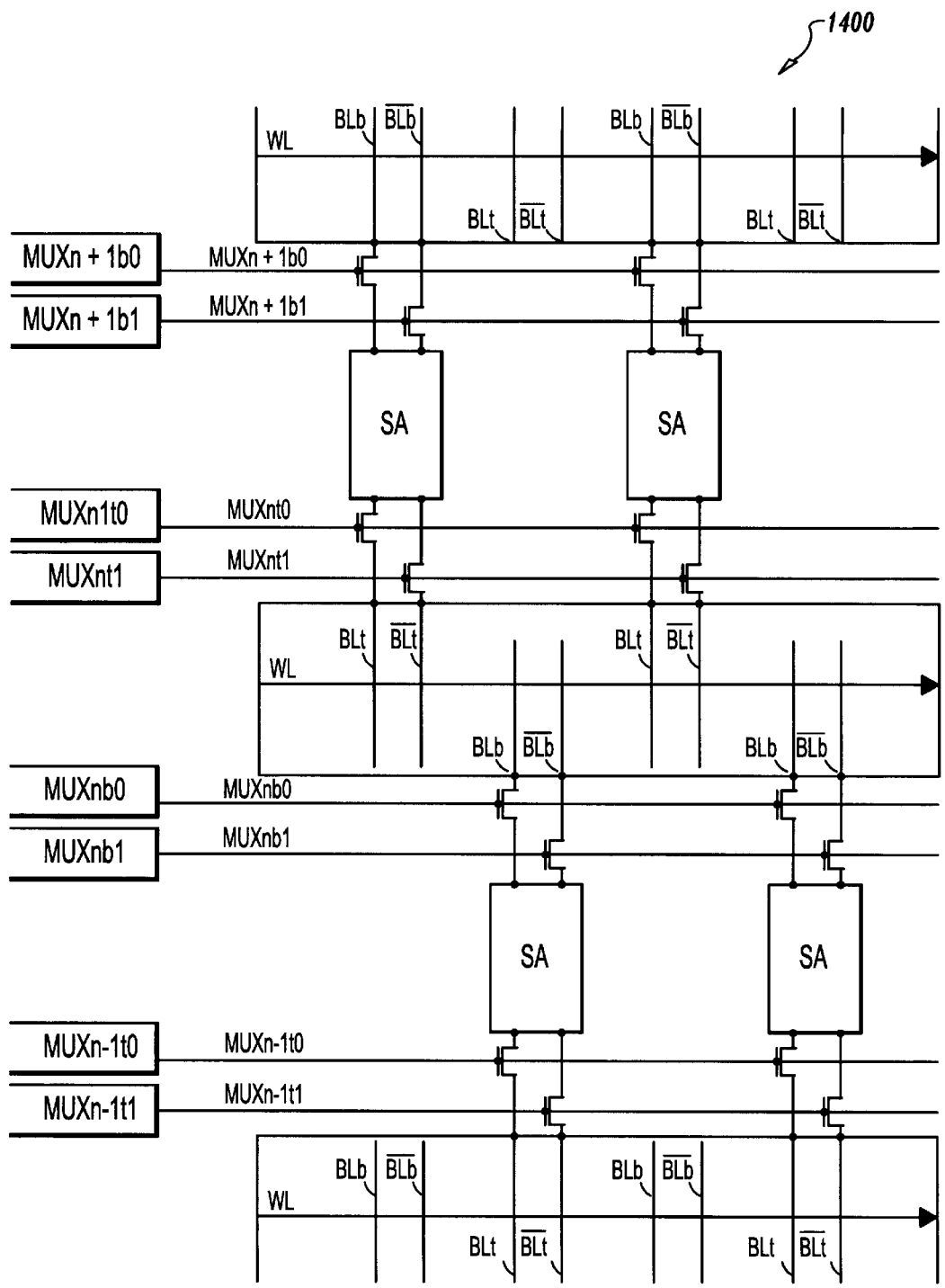
FIG. 14 is a diagram of a dynamic random access memory (DRAM) 1400 according to an illustrative embodiment of the present invention.

The present invention may be further expanded by changing the multiplexer arrangement. FIG. 14 is a diagram of a dynamic random access memory (DRAM) 1400 according to an illustrative embodiment of the present invention. In the DRAM of FIG. 14, each element of a multiplexer pair is controlled independently. By making the signals MUXn+1b0, MUXnt1, MUXnb0, and MUXn−1t1 go HIGH, while making other bitline multiplexer control signals go LOW, the reference bitline BL can be located in a different array that that of the bitline BL to which it is compared by the sense amplifiers. This configuration is similar to a conventional open bitline BL architecture. The open bitline BL architecture generates the array substrate coupling effect to the bitline BL during signal development, sensing, and restore operations. Note that a conventional sensing operation is referred to as implementing a folded bitline architecture. Also note that the conventional sensing operation discussed with respect to FIG. 2 below allows the bitline BL and the bitline $\overline{BL}$ to swing LOW and HIGH, respectively, thus canceling the coupling effect to the array substrate. The open bitline BL architecture allows all bitlines (BLs in one array (i.e., the second array 102n) to swing in the same direction, generating array substrate noise. Studying the noise effect provides knowledge of the resistance of the array substrate, which can be important in improving the manufacturing process of future DRAMs.

Figure 15:
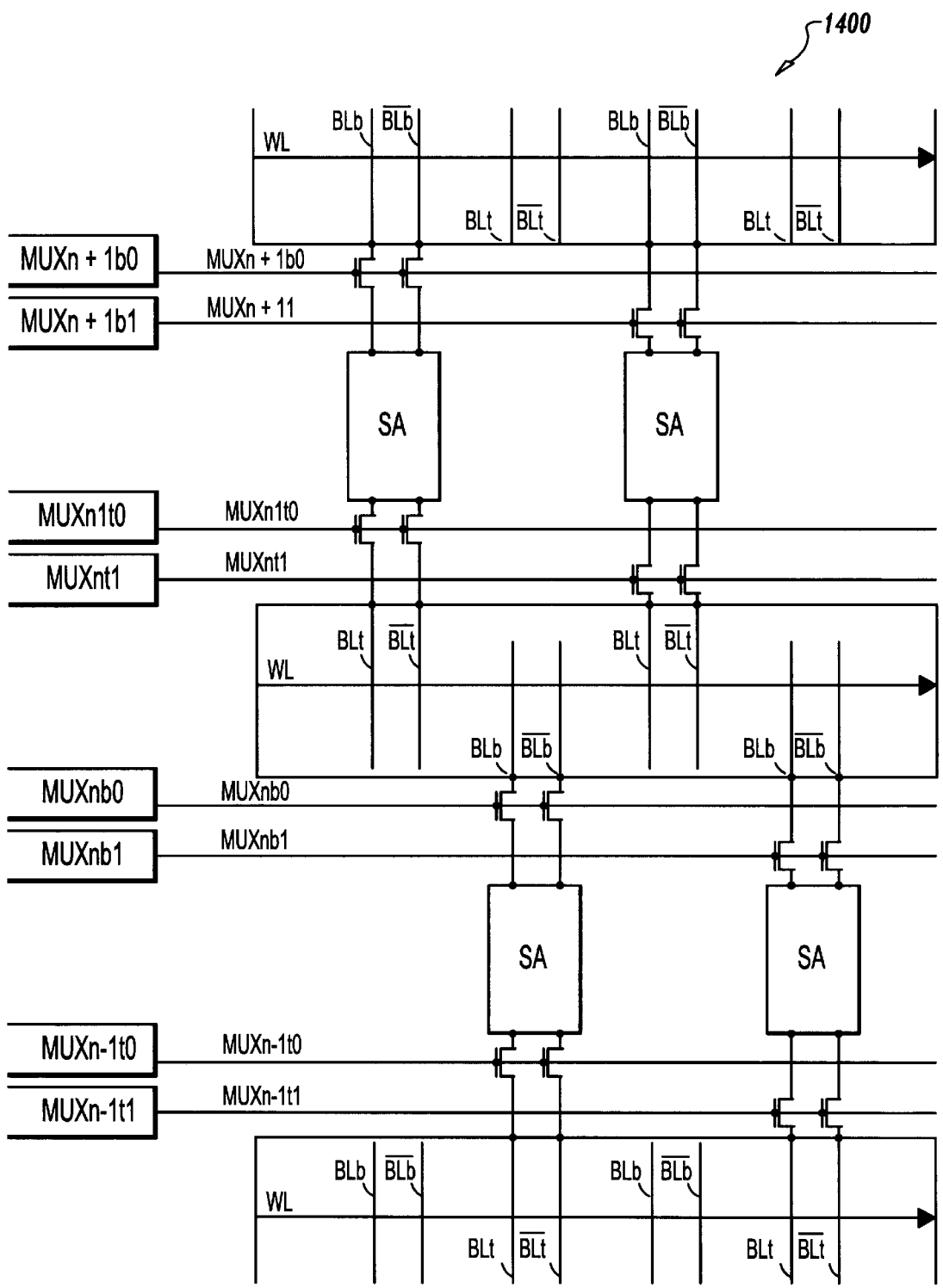
FIG. 15 is a diagram of a dynamic random access memory (DRAM) 1400 according to another illustrative embodiment of the present invention.

FIG. 15 is a diagram of a dynamic random access memory (DRAM) 1400 according to another illustrative embodiment of the present invention. In the DRAM of FIG. 15, every other multiplexer pair can be controlled independently.

Figure 16:
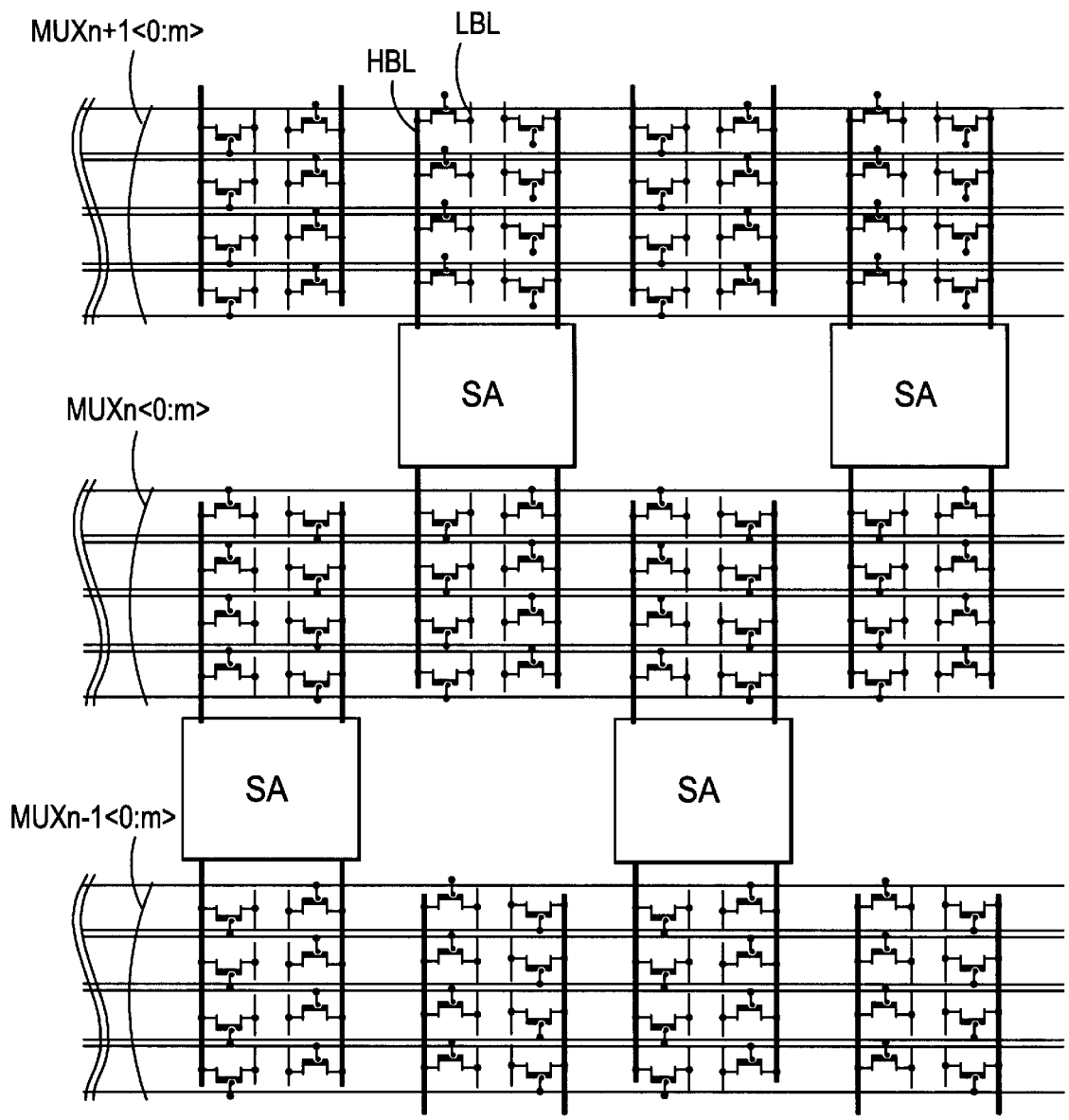
FIG. 16 is a diagram illustrating a DRAM having a hierarchical bitline BL architecture, according to an illustrative embodiment of the present invention.

FIG. 16 is a diagram illustrating a DRAM having a hierarchical bitline BL architecture, according to an illustrative embodiment of the present invention. This architecture divides a bitline BL into several local bitlines LBLs, each coupled to a plurality of memory cells. A plurality of local bitlines LBLs are then coupled to the hierarchical bitline HBL which run over the local bitlines LBLs with the second metal layer. The hierarchical bitline is then coupled to the corresponding sense amplifier. Optionally, the sense amplifier may have an additional multiplexer to selectively couple to two hierarchical bitlines HBLs located in top and bottom array pairs per sense amplifier.

A hierarchical bitline architecture allows for more multiplexers to be programmed, thus providing additional flexibility over other architectures. An important function is the signal margin test mode, where the bitline capacitance can be gradually changed by selecting the number of the activated multiplexers which, in turn, select the number of local bitlines LBLs to couple to hierarchical bitlines HBLS. When n multiplexers open to couple the n local bitlines (LBLs) to the hierarchical bitline (HBL), the sensing signal is ½Vdd $((n \times C_{LBL} + C_{HBL} + C_S)/(C_S))$. It is to be appreciated that by independently controlling the local bitline LBL of the bitline pair independently, the local bitline to local bitline coupling effect can also be verified.

In the DRAM of FIG. 16, the local bitline (LBL) is coupled to the hierarchical bitline (HBL) through the corresponding multiplexer. By independently controlling the multiplexers, a flexible bitline BL test mode is possible.

Figure 17:
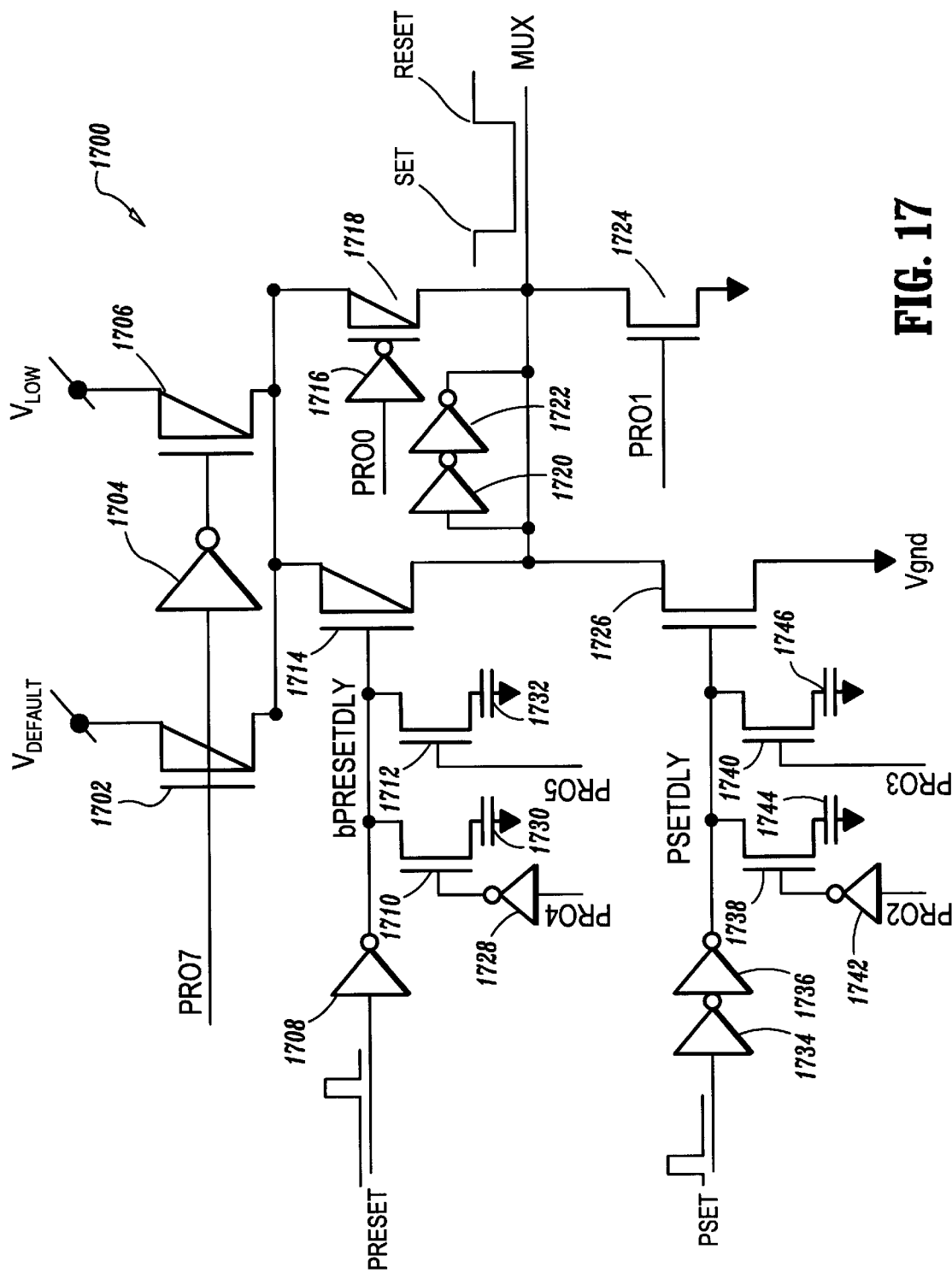
FIG. 17 is a diagram illustrating the control circuit 1700 for the bitline multiplexer, according to an illustrative embodiment of the present invention.

FIG. 17 is a diagram illustrating the control circuit 1700 for the bitline multiplexer, according to an illustrative embodiment of the present invention. The control circuit 1700 contains a CMOS MUX driver 1714, 1726, which drives the corresponding signal MUX (i.e. MUXnt in FIG. 3). The MUX operation is controlled by a pulsed set signal (PSET) and a pulsed reset signal (PRESET). The output signal MUX is set to LOW when the PSET periodically goes HIGH, and is reset to HIGH when the PRESET periodically goes HIGH. This function can be changed according to the following program signals: PRO0; PRO1; PRO2; PRO3; PRO4; PRO5; and PRO7; where the number (i=0, 1, 2, 3, 4, 5, and 7) indicates the function address bit shown in Table 1. The control logic for PRO6, and PRO8~12 for the functions 6, and 8~12 are not shown for the sake of brevity. The generation of the signal PRQi is controlled by detecting the test mode command followed by the function address vector. If the address bit i in the function address vector is HIGH, the corresponding PROi goes HIGH. It is assumed that the signal MUX remains HIGH in a standby state, and all PRO signals are LOW in a default state. The detailed operation of the default state and programming state are discussed under the presumption that array 102n is selected. The following example is for the MUX control operation for MUXnt. The methods of the PROi control and PEST and PRSET are not within the scope of the present invention and, thus, are not further described herein.

When the signal array 102n is selected, a pulsed set signal (PSET) periodically goes HIGH. This makes a delayed pulsed set signal (PSETDLY) HIGH after two inverter 1734, 1736 delays. A LOW level of PRO2 is inverted by an inventor 1742, opening the NMOS transistor 1738. This couples the node PSETDLY to the capacitor 1744. On the other hand, a LOW level of PRO3 disables the NMOS transistor 1740 and, thus, the node PSETDELY is isolated from the capacitor 1746. When the signal PSETDLY is periodically HIGH, the NMOS transistor 1726 drives the signal MUX to LOW. The MUX voltage is maintained by a CMOS full latch 1720, 1722 until the PMOS transistor 1714 is turned ON. When the signal array 102n is disabled, a pulsed reset signal (PRESET) periodically goes HIGH. This makes a delayed pulsed reset signal (bPRESETDLY) periodically LOW. A LOW level of PRO4 is inverted by the inverter 1728, opening the NMOS transistor 1710. This couples the node bPRESET to the capacitor 1730. On the other hand, a LOW level of PRO5 disables the NMOS transistor 1712, therefore the node bPRESET is isolated from the capacitor 1732. When the bPRESETDLY periodically goes LOW, the PMOS transistor 1714 drives the signal MUX to HIGH. A LOW level of PRO7 opens the PMOS transistor 1702. On the other hand, the PMOS transistor 1706 is OFF because the inverted signal of PRO7 output by the inverter 1704 is HIGH. The HIGH level voltage of the MUX is a default voltage (VDEFAULT). The LOW level of the signal PRO0 is inverted by the inverter 1716, disabling the PMOS driver 1718. The LOW level of the signal PRO1 disables the NMOS transistor 1724.

When the PRO0 goes HIGH, the PMOS transistor 1718 is turned ON, driving the signal MUX to HIGH. Alternatively, if the PRO1 is HIGH, the NMOS transistor 1724 is turned ON, driving the signal MUX to LOW. Additionally, PSET and PRESET should stay LOW when either PRO1 or PRO2 go HIGH. The logic to keep PSET and PRESET LOW is well-known to one of ordinary skill in the related art and, thus, is not described further herein. The MUX set timing can be increased or delayed by activating PRO2 or PRO3, respectively. When the PRO2 is HIGH, the node PSETDLY is isolated from the capacitor 1744 because the NMOS transistor 1738 is OFF. This reduces the signal transition time of PSETDLY, making the signal MUX set timing early.

When the PRO3 is HIGH, the node PSETDLY couples to the additional capacitor 1746 through the NMOS transistor 1740. This increases the signal transition time of PSETDLY, making the signal MUX set timing delayed. Similarly, the MUX reset timing can be fastened or delayed by activating PRO4 and PRO5, respectively. When the PRO4 is HIGH, the node bPRESETDLY is isolated from the capacitor 1730 because the NMOS 1710 is OFF. This reduces the signal transition time of bPRESETDLY, making the signal MUX reset timing early. When the PRO5 is HIGH, the node PRESETDLY couples to the additional capacitor 1732 through the NMOS transistor 1712. This increases the signal transition time of PSETDLY, making the signal MUX set timing delayed. When the PRO7 goes HIGH, the PMOS transistor 1702 is turned OFF, but the PMOS transistor 1706 is turned ON. Thus, this allows the source voltages of the PMOS transistors 1714, 1718 to change which, in turn, allows the MUX high voltage to be reduced to a lower voltage source than the VDEFAULT (VLOW).

Although the illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A semiconductor memory device, comprising:
   a plurality of memory cells arranged in at least two groups;
   at least one sense amplifier disposed between the at least two groups;
   a first and a second multiplexer, each adapted to couple at least one of said at least two groups to inputs of said at least one amplifier for at least one sensing operation; and
   at least one user programmable control device adapted to control said first and said second multiplexer.

2. The semiconductor memory device according to claim 1, wherein said at least one programmable control device is adapted to control said multiplexers independently.

3. The semiconductor memory device according to claim 1, wherein said at least one programmable control device is further adapted to output at least one control signal for controlling at least one of said multiplexers.

4. The semiconductor memory device according to claim 1, wherein said at least one programmable control device is adapted to control said multiplexers based on predetermined address vectors.

5. The semiconductor memory device according to claim 1, wherein said at least one programmable control device is further adapted to engage the semiconductor memory in a test mode upon receiving a test mode command, and to control at least one of said multiplexers upon receiving a function set command.

6. The semiconductor memory device according to claim 5, wherein the function set command comprises an address vector that identifies at least one of said multiplexers and at least one function corresponding thereto.

7. The semiconductor memory device according to claim 1, wherein said at least one programmable control device is adapted to control at least one of said multiplexers to always be ON or OFF.

8. The semiconductor memory device according to claim 1, wherein said at least one programmable control device is adapted to control a timing of at least one of a set phase and a reset phase of at least one of said multiplexers.

9. The semiconductor memory device according to claim 1, wherein said at least one programmable control device is adapted to control a voltage of a control signal corresponding to at least one of said multiplexers.

10. The semiconductor memory device according to claim 1, wherein said at least one programmable control device is adapted to set at least one control signal corresponding to at least one of said multiplexers to at least one predetermined condition.

11. The semiconductor memory device according to claim 1, wherein said at least one programmable control device is further adapted to invert at least one control signal corresponding to at least one of said multiplexers.

12. The semiconductor memory device according to claim 1, wherein said first and second multiplexers respectively couple a first bitline and a corresponding reference bitline to said at least one sense amplifier independently.

13. The semiconductor memory device according to claim 1, wherein said first and second multiplexers respectively couple a first bitline in one of the two groups and a second bitline in the other group to said at least one sense amplifier, to provide an open bitline architecture.

14. The semiconductor memory device according to claim 1, wherein said at least one programmable control device independently controls each bitline in a bitline pair.

15. The semiconductor memory device according to claim 1, wherein said at least one programmable control device independently controls every other bitline pair.

16. A semiconductor memory device, comprising:
   a plurality of memory cells arranged in a plurality of groups;
   a plurality of sense amplifiers disposed between the plurality of groups;
   a plurality of multiplexers, each of the multiplexers being adapted to couple inputs of at least one of said plurality of sense amplifiers to at least one of said plurality of groups for a sensing operation; and
   a plurality of user programmable control devices, each device adapted to independently control at least one of said plurality of multiplexers.

17. The semiconductor memory device according to claim 16, wherein said at least one programmable control device is further adapted to output at least one control signal for controlling at least one of said first and said second multiplexer.

18. The semiconductor memory device according to claim 16, wherein said at least one programmable control device is adapted to control said first and said second multiplexer based on predetermined address vectors.

19. The semiconductor memory device according to claim 16, wherein said at least one programmable control device is further adapted to engage the semiconductor memory in a test mode upon receiving a test mode command, and to control at least one of said first and said second multiplexer upon receiving a function set command.

20. The semiconductor memory device according to claim 19, wherein the function set command comprises an address vector that identifies at least one of said first and said second multiplexer and at least one function corresponding thereto.

21. A method for controlling multiplexers in a semiconductor memory device, comprising the steps of:

receiving a predetermined address;

identifying at least one control signal and associated function, respectively, based upon the predetermined address, both the control signal and the function corresponding to at least one of the multiplexers; and controlling the at least one of the multiplexers based on the identified control signal and the function.

22. The method according to claim 21, further comprising the step of placing the semiconductor memory in a test mode, prior to said receiving step.

23. The method according to claim 21, further comprising the step of testing operating parameters of the semiconductor memory device by individually controlling at least one of the multiplexers.

24. The method according to claim 21, wherein the multiplexers are controlled individually.

25. A semiconductor memory device, comprising:

a plurality of sense amplifiers;

a plurality of memory cells arranged in a plurality of groups;

a plurality of local bitlines, each of the local bitlines being coupled to a memory cell in one of the groups;

a plurality of hierarchical bitlines, each of the hierarchical bitlines being coupled to at least one of the sense amplifiers and all of the memory cells in one of the groups;

a first plurality of multiplexers, each of the first plurality of multiplexers being coupled to one of the local bitlines and one of the hierarchical bitlines; and at least one first user programmable control device adapted to control at least one of the first plurality of multiplexers through a plurality of user programmable functions.

26. The semiconductor memory device according to claim 25, wherein said plurality of local bitlines and said plurality of hierarchical bitlines are disposed on different layers of the semiconductor memory device.

27. The semiconductor memory device according to claim 25, further comprising:

a second plurality of multiplexers, each of the second plurality of multiplexers being coupled to at least one of the sense amplifiers and at least one of the hierarchical bitlines; and at least one second programmable control device adapted to control at least one of the second plurality of multiplexers.

28. The semiconductor memory device according to claim 25, wherein the at least one first programmable control device is adapted to provide independent control of the first plurality of multiplexers.

29. The semiconductor memory device according to claim 25, wherein the at least one second programmable control device is adapted to provide independent control of the second plurality of multiplexers.

30. The semiconductor memory device according to claim 1, wherein the at least one programmable control device is further adapted to receive and implement user defined modifications to programmable control functions for controlling said first and said second multiplexer.

31. The semiconductor memory device according to claim 16, wherein the semiconductor memory device further comprises a plurality of bitline pairs, and at least one of the plurality of programmable control devices is further adapted to control the plurality of sense amplifiers such that every other of the plurality of sense amplifiers are coupled to two bitline pairs in each of the plurality of groups to create a different bitline capacitance for the two bitline pairs in each of the plurality of groups with respect to any remaining bitline pairs in each of the plurality of groups for a testing function.

* * * * *

UNITED STATES PATENT AND TRADEMARK OFFICE
CERTIFICATE OF CORRECTION

PATENT NO.     : 6,272,062 B1
DATED          : August 7, 2001
INVENTOR(S)    : Toshiaki Kirihata, Gerhard Mueller and Dmitry Netis It is certified that error appears in the above-identified patent and that said Letters Patent is hereby corrected as shown below:

Title page,
Item [73], Assignee, "Infineon Technologies AG, Munich (DE)" should read
-- Infineon Technologies AG, Munich (DE) and International Business Machines Corporation, Armonk, NY (US) --

Signed and Sealed this

Ninth Day of November, 2004

JON W. DUDAS
*Director of the United States Patent and Trademark Office*